US010863065B2

(12) United States Patent
Chiu et al.

(10) Patent No.: US 10,863,065 B2
(45) Date of Patent: Dec. 8, 2020

(54) CAMERA MODULE AND MANUFACTURING METHOD THEREOF

(71) Applicant: Issa Technology Co., Ltd., Taoyuan (TW)

(72) Inventors: Chi-Wei Chiu, Taoyuan (TW); Rong-Jhe Chen, Taoyuan (TW)

(73) Assignee: ISSA TECHNOLOGY CO., LTD., Taoyuan (TW)

( * ) Notice: Subject to any disclaimer, the term of this patent is extended or adjusted under 35 U.S.C. 154(b) by 0 days.

(21) Appl. No.: 16/382,333

(22) Filed: Apr. 12, 2019

(65) Prior Publication Data
US 2020/0120240 A1 Apr. 16, 2020

(30) Foreign Application Priority Data

Oct. 12, 2018 (TW) .............................. 107136012 A

(51) Int. Cl.
*H04N 5/225* (2006.01)
*G02B 7/02* (2006.01)
*H05K 1/02* (2006.01)
*H05K 1/14* (2006.01)
*H04N 13/239* (2018.01)

(52) U.S. Cl.
CPC ........... *H04N 5/2253* (2013.01); *G02B 7/021* (2013.01); *H04N 5/2252* (2013.01); *H04N 5/2254* (2013.01); *H05K 1/028* (2013.01); *H05K 1/14* (2013.01); *H04N 13/239* (2018.05); *H04N 2213/001* (2013.01); *H05K 2201/10121* (2013.01); *H05K 2201/10151* (2013.01)

(58) Field of Classification Search
None
See application file for complete search history.

(56) References Cited

U.S. PATENT DOCUMENTS

| | | | |
|---|---|---|---|
| 2004/0021792 A1* | 2/2004 | Yasui | H04N 5/2253 348/373 |
| 2006/0091487 A1* | 5/2006 | Hanada | H01L 24/48 257/432 |
| 2009/0180021 A1* | 7/2009 | Kikuchi | H04N 5/2253 348/349 |
| 2015/0158435 A1* | 6/2015 | Ohsumi | G01C 3/18 348/375 |
| 2017/0123178 A1* | 5/2017 | Wang | G02B 7/003 |
| 2017/0146766 A1* | 5/2017 | Hsu | G02B 7/025 |
| 2017/0195537 A1* | 7/2017 | Chang | H04N 5/232 |
| 2018/0177082 A1* | 6/2018 | Wei | H05K 9/0064 |

(Continued)

*Primary Examiner* — William B Perkey
(74) *Attorney, Agent, or Firm* — McClure, Qualey & Rodack, LLP

(57) ABSTRACT

A camera module includes a holder frame, a first lens unit, a second lens unit, a first image-sensing unit and a second image-sensing unit. The holder frame includes a first fixed portion and a second fixed portion. The first lens unit is disposed through the first fixed portion and has a first light incident end and a first light exit end. The second lens unit is disposed through the second fixed portion and has a second light incident end and a second light exit end. The first image-sensing unit is disposed opposite to the first light exit end of the first lens unit. The second image-sensing unit is disposed opposite to the second light exit end of the second lens unit. In addition, a manufacturing method of a camera module is also disclosed.

10 Claims, 5 Drawing Sheets

(56) References Cited

U.S. PATENT DOCUMENTS

| | | | | |
|---|---|---|---|---|
| 2018/0224625 A1* | 8/2018 | Tseng | .................. | G02B 27/017 |
| 2018/0367720 A1* | 12/2018 | Lu | ........................ | H04N 5/2258 |
| 2019/0045094 A1* | 2/2019 | Fletcher | .................. | G06K 9/28 |
| 2019/0369678 A1* | 12/2019 | Park | ...................... | G06F 1/1686 |
| 2020/0021720 A1* | 1/2020 | Wang | .................. | H04N 5/2254 |

* cited by examiner

CAMERA MODULE AND MANUFACTURING METHOD THEREOF

CROSS REFERENCE TO RELATED APPLICATIONS

This Non-provisional application claims priority under 35 U.S.C. § 119(a) on Patent Application No. 107136012 filed in Republic of China on Oct. 12, 2018, the entire contents of which are hereby incorporated by reference.

BACKGROUND

1. Technical Field

The present invention generally relates to a camera module and manufacturing method of the camera module, and more particularly, to a camera module with multi-lens and its manufacturing method.

2. Description of Related Art

Digital cameras, with the development of digital technology, have already replaced traditional film cameras. Camera modules, thanks to the continuous miniaturization and compactness, can be embedded into almost all kinds of electronic devices.

As shown in FIG. 1, a conventional camera module 10 includes a lens set 11, a lens holder 12, an image-sensing component 13, a circuit substrate 14, and a flexible circuit board 15.

The lens set 11 is composed of a number of lenses and has a light incident end 111 and a light exit end 112.

The lens holder 12 has an opening 121, and the lens set 11 is set and fixed in the opening 121, and the light incident end 111 of the lens set 11 is exposed to the first end 122 of the lens holder 12, and the light exit end 112 is exposed to a second end 123 of the lens holder 12.

The image-sensing component 13 is corresponding to the second end 123 of the lens holder 12 corresponding to the light exit end 112 of the lens set 11 to receive light passing through the lens set 11. In addition, the image-sensing component 13 is electrically connected to the circuit substrate 14. In addition to being responsible for the electrical signal transmission of the image-sensing component 13, the circuit substrate 14 also can be as a carrier board.

Furthermore, the circuit substrate 14 is set on and electrically connected to the flexible circuit board 15 to complete the camera module 10.

In general, the camera module 10 converts the light incident on the lens set 11 into an electrical signal by the image-sensing component 13, and the image-sensing component 13 senses the source light through the photoelectric effect, thereby converting the ability to store the electric charge. In short, the energy of the light is converted into an electric charge when the surface of the image-sensing component 13 receives light from the lens set 11. The stronger the light is, the more the charges are. And these charges become the basis for judging the intensity of the light. Channel wires are arranged on the image-sensing component 13 so that the electric charges are transmitted to the amplifier decoder to restore the signal generated by the image-sensing component 13 and form a complete picture.

In an optical system, any problem of refraction, reflection, or diffraction of light may affect the image quality of an image. In the above camera modules, assembly tolerances may exist in the assembly of each component, especially the solder used in the electrical connection, which may cause the angle between the components to be inclined, and thus affect the image quality. The general processing method is to use the algorithm to reduce the impact of assembly tolerance on image quality.

Furthermore, with the development of technology, the combination of two camera modules is gradually being used because it can be applied within more technique field, such as measuring distance, capturing 3D images, simulating optical focus, or making editing images more selective. Therefore, it is gradually applied to higher-end electronic products. However, the assembly tolerance issues described above continue to exist in applications where two camera modules are used. There may be three axial angular errors for a single camera module. However, for more than two camera modules, the combined probability of error will be a multiple, which makes the algorithm error difficult to correct.

It is therefore to provide a camera module and its manufacturing method to improve the aforementioned deficiencies is one of the important issues at present.

SUMMARY OF THE INVENTION

In view of the above, one of the objects of the present invention is to provide a camera module and a manufacturing method that can improve the image quality degradation caused by assembly or process tolerances, thereby improving the image quality of the camera module.

To achieve the above, the present invention provides a camera module including a holder frame, a first lens unit, a second lens unit, a first image-sensing unit, and a second image-sensing unit. The holder frame has a first fixed portion and a second fixed portion. The first lens unit is set on and fixed to the first fixing portion and has a first light incident end and a first light exit end. The second lens unit is set on and fixed to the second fixing portion and has a second light incident end and a second light exit end. The first image-sensing unit is set corresponding to the first light exit end of the first lens unit. The second image-sensing unit is set corresponding to the second light exit end of the second lens unit.

According to one embodiment, the first fixed portion and the first lens unit are screwed and fixed, and the second fixed portion and the second lens unit are screwed and fixed.

According to one embodiment, the first fixed portion is closely matched and fixed with the first lens unit, and the second fixed portion is closely matched and fixed with the second lens unit.

According to one embodiment, the camera module further includes a circuit bridgeboard that is set corresponding to the holder frame.

According to one embodiment, the camera module includes a flexible circuit board, which is electrically connected between the first image-sensing unit, the second image-sensing unit and the circuit bridgeboard.

According to one embodiment, the camera module further includes a first flexible circuit board and a second flexible circuit board. The first flexible circuit board is electrically connected between the first image-sensing unit and the circuit bridgeboard. The second flexible circuit board is electrically connected between the second image-sensing unit and the circuit bridgeboard.

According to one embodiment, the material of the holder frame is metal or plastic. The metal can be, for example, stainless steel, aluminum or copper. The plastic can be, for example, glass fiber reinforced plastic, polyoxymethylene, polyvinyl chloride or an acrylonitrile-butadiene-styrene copolymer.

In addition, in order to achieve the above, the present invention provides a manufacturing method of camera module, including the following step 1 to 5. The first step is to provide a holder frame; the second step is to set a first lens unit to a first fixed portion of the holder frame; and the third step is to set a second lens unit to a second fixed portion of the holder frame. The fourth step is to connect a first image-sensing unit to a first light exit end of the first lens unit; and the fifth step is to match a second image-sensing unit to a second light exit end of the second lens unit. It is worth mentioning that the order of the above steps 1 to 5 is restrictive.

According to one embodiment, the first lens unit is disposed on the first fixed portion in a screwing manner, and the second lens unit is disposed on the second fixed portion in a screwing manner.

According to one embodiment, the manufacturing method further includes electrically connecting a first flexible circuit board between the first image-sensing unit and a circuit bridgeboard, and electrically connecting a second flexible circuit board between the second image-sensing unit and the circuit bridgeboard.

Furthermore, in order to achieve the above object, the present invention provides a manufacturing method of a camera module, including the following step 6 to step 9. Step 6 is to provide a holder frame having a first fixed portion and a second fixed portion. Step 7 is to connect a first lens unit to the first fixed portion and to connect a second lens unit to the second fixed portion. Step 8 is to dispose a first image-sensing unit on a first flexible circuit board, and to dispose a second image-sensing unit on a second flexible circuit board. Step 9 is to connect the first image-sensing unit to the first fixed portion corresponding to a first light exit end of the first lens unit, and to connect the second image-sensing unit to the second fixed portion corresponding to the second light exit end of the second lens unit.

According to one embodiment, before the first image-sensing unit is connected to the first fixed portion, and the second image-sensing unit is connected to the second fixed portion, the manufacturing method further includes the steps of enabling the first image-sensing unit and the second image-sensing unit to generate a first image and a second image, respectively; and adjusting the relative position of the first lens unit and the first image-sensing unit, and adjusting the relative position of the second lens unit and the second image-sensing unit, so that the first image and the second image have a predetermined focal length.

According to one embodiment, the first image-sensing unit is glued to the first fixed portion and the second image-sensing unit is glued to the second fixed portion.

As described above, according to the camera module and the manufacturing method of the camera module, a plurality of lens units are disposed in a single holder frame to fix the distance between the lens units from the tolerance of the assembly process. In addition, this method reduces the use of adhesive components such as adhesives and solders, and greatly improves the possibility of tilting the camera module.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

DETAILED DESCRIPTION

Reference will now be made to the drawings to describe various inventive embodiments of the present disclosure in detail, wherein like numerals refer to like elements throughout.

Figure 1:
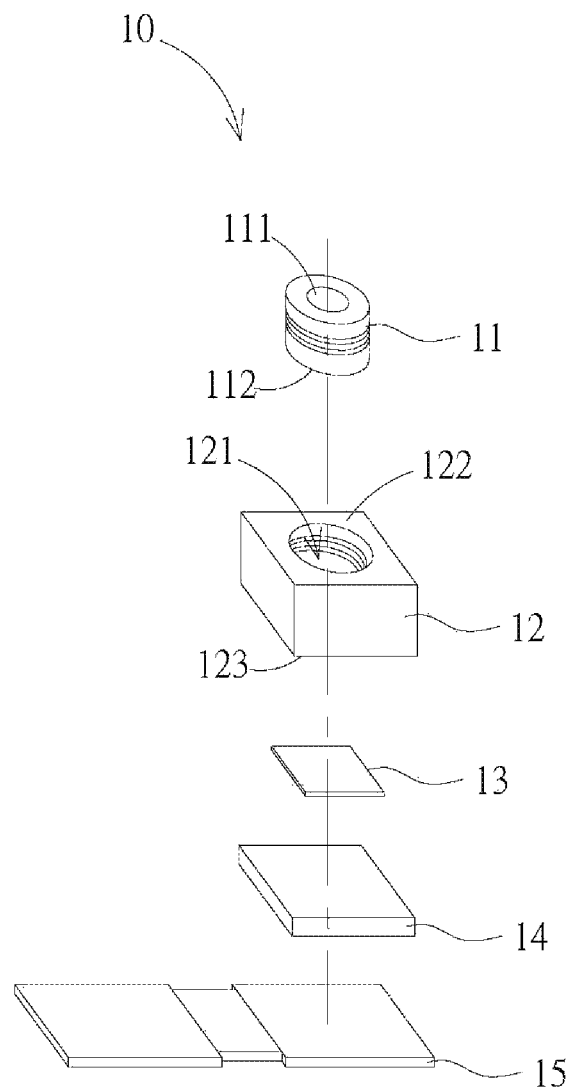
FIG. 1 is a schematic exploded view showing a conventional camera module.
Figure 2:
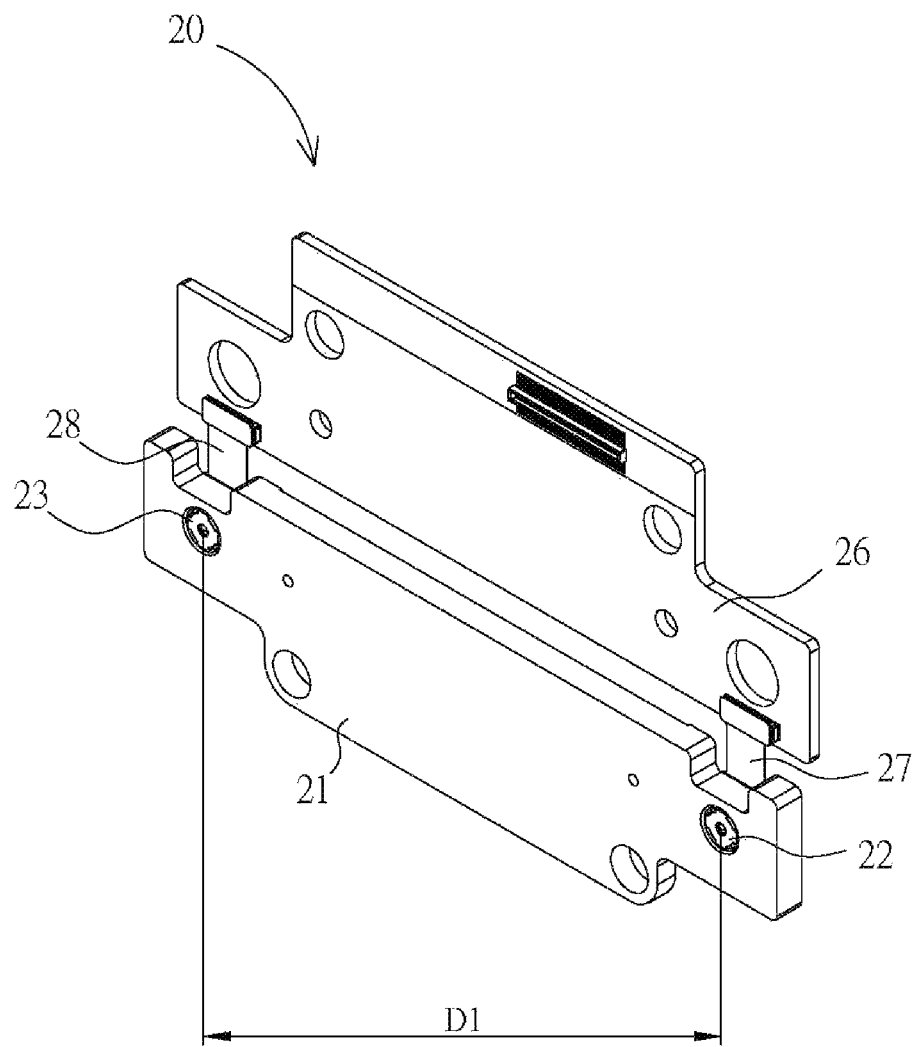
FIG. 2 is a schematic structural view showing a camera module according to the preferred embodiment on the present invention.
Figure 3:
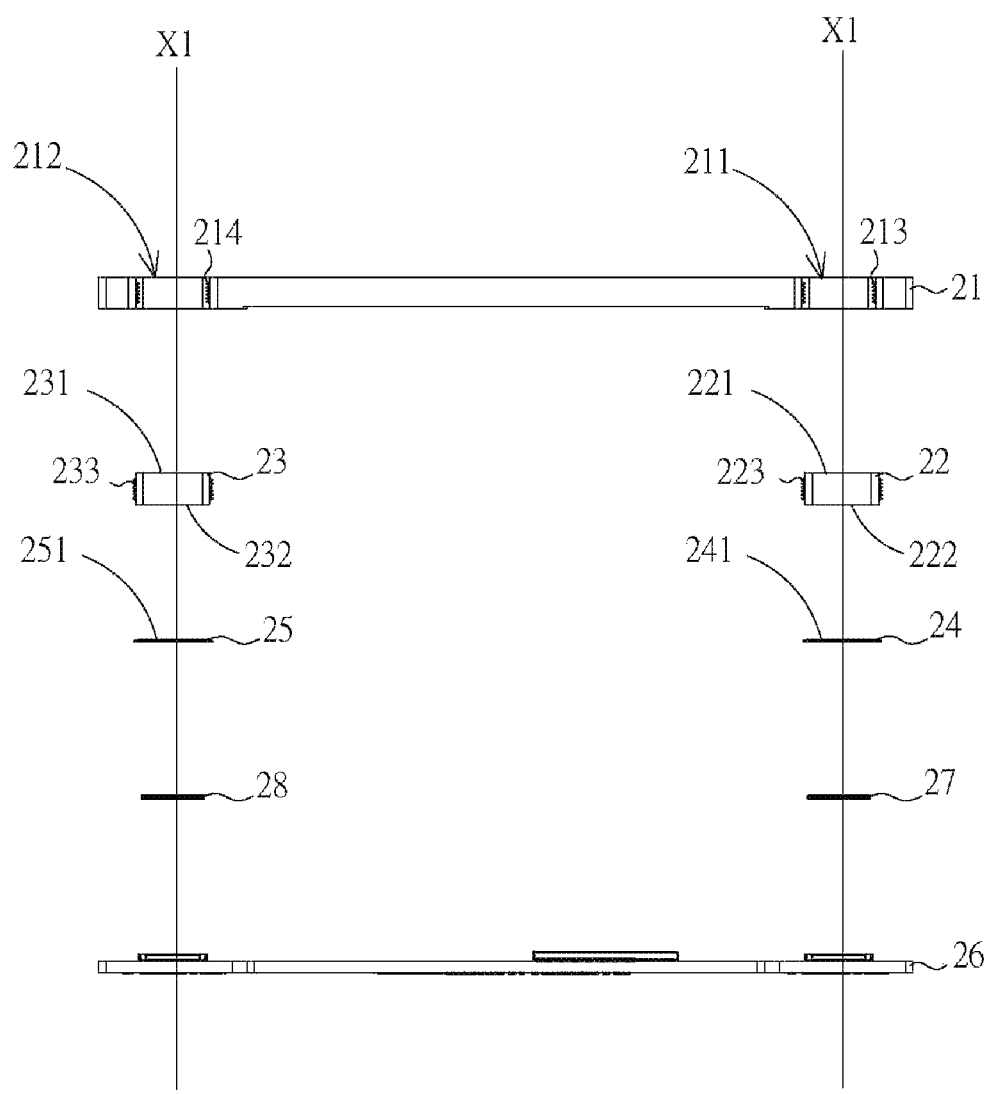
FIG. 3 is a schematic exploded view showing the camera module according to the preferred embodiment on the present invention.
Figure 4:
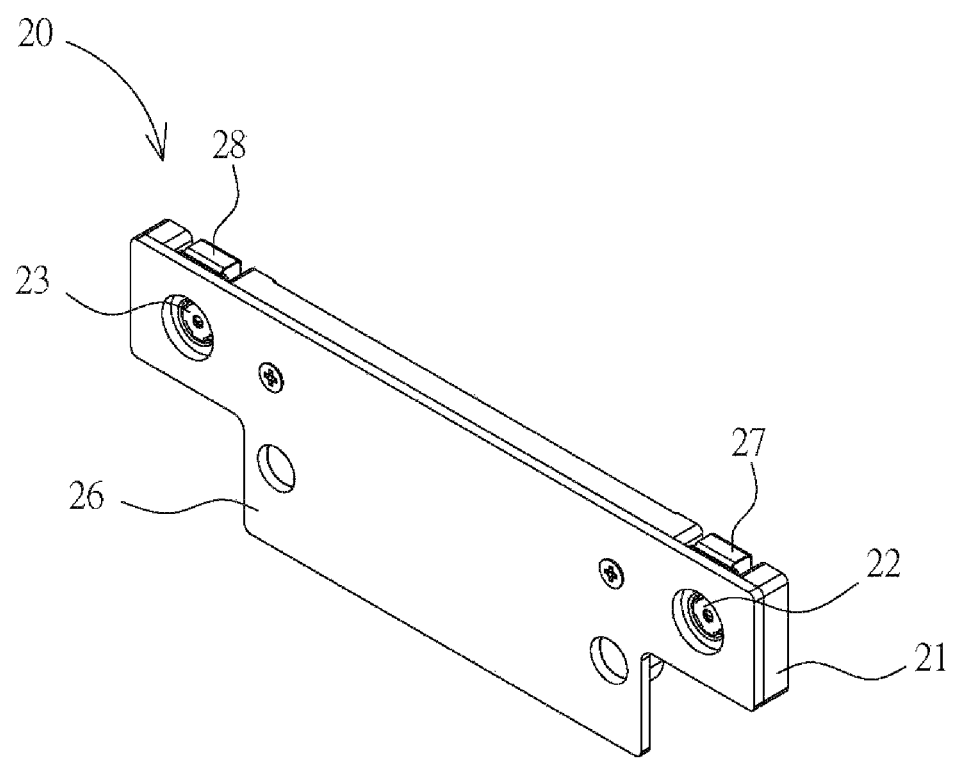
FIG. 4 is a schematic structural view showing the camera module according to the preferred embodiment on the present invention.
Figure 5:
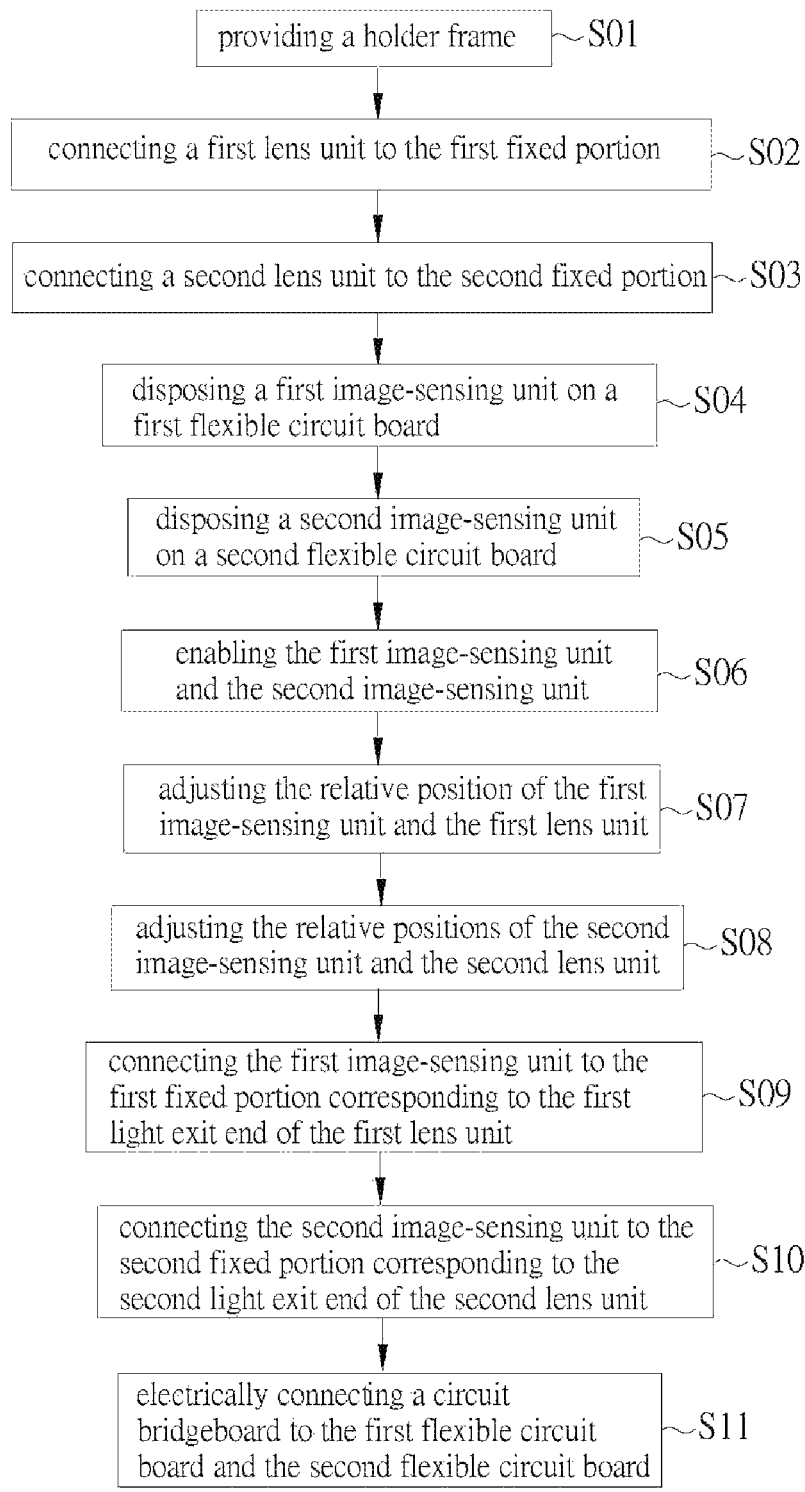
FIG. 5 is the manufacturing method flow chart of the camera module according to a preferred embodiment on the present invention.

According to a preferred embodiment of the present invention, wherein FIG. 2 is a schematic structural view of a camera module; FIG. 3 is a schematic exploded view of the camera module; FIG. 4 is a schematic structural view of the camera module; and FIG. 5 is the manufacturing method flow chart of the camera module.

Referring to FIG. 2 and FIG. 3 simultaneously, according to a preferred embodiment of the present invention, a camera module 20 includes a holder frame 21, a first lens unit 22, a second lens unit 23, a first image-sensing unit 24, a second image-sensing unit 25, a circuit bridgeboard 26, a first flexible circuit board 27 and a second flexible circuit board 28. In the embodiment, the camera module 20 of the present embodiment is used as a stereo camera.

The material of the holder frame 21 may be metal or plastic. The metal can be, for example, a metal such as stainless steel, aluminum or copper which is structurally supportive and is not easily deformed. The plastic can be, for example, a glass fiber reinforced plastic, a polyoxymethylene, a polyvinyl chloride or an acrylonitrile-butadiene-styrene copolymer.

In addition, the holder frame 21 has a first fixed portion 211 and a second fixed portion 212. In this embodiment, the first fixed portion 211 and the second fixed portion 212 have an opening respectively, and have threads 213, 214 on the side wall of the opening. The first fixed portion 211 and the second fixed portion 212 have a predetermined spacing D1 on the holder frame 21, which is a distance obtained by the software algorithm according to the required image effect or function.

The first lens unit 22 is composed of a number of lenses and a casing. The outer side of the casing has a thread 223 corresponding to the thread 213 of the first fixed portion 211, and has a first light incident end 221 and a first light exit end 222. The first lens unit 22 is set through the first fixed portion 211 of the holder frame 21, and the first lens unit 22 is stably fixed in the first fixed portion 211 in a screwing manner.

Similar to the first lens unit 22, the second lens unit 23 is composed of a number of lenses and a casing. The outer side of the casing has a thread 233 corresponding to the thread 214 of the second fixed portion 212, and has a second light incident end 231 and a second light exit end 232. The second lens unit 23 is set through the second fixed portion 212 of the holder frame 21, and the second lens unit 23 is stably fixed in the second fixed portion 212 in a screwing manner.

The first image-sensing unit 24 is disposed corresponding to the first light exit end 222 of the first lens unit 22. In this embodiment, the first image-sensing unit 24 has a first photosensitive surface 241 disposed corresponding to the first light exit end 222 of the first lens unit 22 to receive the light entered the first light incident end 221 from the first lens unit 22.

Similar to the first image-sensing unit 24, the second image-sensing unit 25 is disposed corresponding to the second light exit end 232 of the second lens unit 23. In this embodiment, the second image-sensing unit 25 has a second photosensitive surface 251, which is disposed corresponding to the second light exit end 232 of the second lens unit 23 to receive the light of the second lens unit 23 from the second light incident end 231.

In this embodiment, the first image-sensing unit 24 and the second image-sensing unit 25 may be a complementary metal oxide semiconductors (CMOS) or may be a charge coupled device (CCD).

The circuit bridgeboard 26 can be a printed circuit board. The first flexible circuit board 27 is electrically connected between the first image-sensing unit 24 and the circuit bridgeboard 26. The second flexible circuit board 28 is electrically connected between the second image-sensing unit 25 and the circuit bridgeboard 26.

In the embodiment, the appearance of the circuit bridgeboard 26 is similar to that of the holder frame 21, so that the camera module 20 can have a simple appearance in addition to electrical and optical performance after assembly. In addition, by the flexibility of the first flexible circuit board 27 and the second flexible circuit board 28, the circuit bridgeboard 26 and the holder frame 21 can be kept compact after folding (as shown in FIG. 4).

As described above, since the holder frame 21 is made of a metal or plastic material which has a supporting force and is not easily deformed, the lens unit and the fixed portion are firmly coupled by screwing, so that the position of the first lens unit 22 and the second lens unit 23 can be accurately fixed. In other words, the distance between the first lens unit 22 and the second lens unit 23 is defined by the predetermined spacing D1 of the first fixed portion 211 and the second fixed portion 212, and the direction and angle of the lens axis X1 of the first lens unit 22 and the second lens unit 23 are defined by the design of the first fixed portion 211 and the second fixed portion 212. Therefore, the assembly tolerance variable of the camera module 20 can be reduced, so that the image quality it presents can be improved, and the complexity of the algorithm can be reduced, thereby reducing the burden on the processing unit (or arithmetic unit).

The above embodiment is described by taking two lens units as an example. According to the actual needs, more fixed portions can be designed on the holder frame to engage with the corresponding lens units.

In addition, the first lens unit and the first fixed portion may be connected in a tight fit manner or snap fit in addition to being screwed. Furthermore, the second lens unit and the second fixed portion may also be connected in a tight fit manner or snap fit in addition to being screwed.

Moreover, in other embodiments, the first flexible circuit board and the second flexible circuit board can be integrated into a single flexible circuit board, and not limited to each lens unit must be independently matched with a flexible circuit board.

Referring to FIG. 5 again, a manufacturing method of a camera module according to a preferred embodiment of the present invention includes the following steps.

Step S01 is to provide a holder frame, which may be CNC machined or injection molded depending on the material, but not limited thereto. In this embodiment, the formed holder frame has a first fixed portion and a second fixed portion in the form of openings, and each has a thread on the side wall of the opening.

Step S02 is to connect a first lens unit to the first fixed portion of the holder frame, and step S03 is to connect a second lens unit to the second fixed portion of the holder frame. In this embodiment, step S02 and step S03 can be performed simultaneously, which is to make the first lens unit correspond to the first fixed portion, and is coupled to the first fixed portion, and the second lens unit corresponding to the second fixed portion is connected to the second fixed portion.

Step S04 is to dispose a first image-sensing unit on a first flexible circuit board, and step S05 is to dispose a second image-sensing unit on a second flexible circuit board. In this embodiment, the first image-sensing unit and the second image-sensing unit are electrically connected to the first flexible circuit board and the second flexible circuit respectively by solder balls, conductive bumps or conductive pastes.

Step S06 is to enable the first image-sensing unit and the second image-sensing unit. In this embodiment, the power is transmitted through the first flexible circuit board and the second flexible circuit board, so that the first image-sensing unit generates a first image, and the second image-sensing unit generates a second image.

Step S07 is to adjust the relative position of the first image-sensing unit and the first lens unit, and step S08 is to adjust the relative position of the second image-sensing unit and the second lens unit, so that the imaging of the first image and the second image has a predetermined focal length and aligning the horizontal and oblique images of the first image and the second image. In this embodiment, the so-called predetermined focal length is for the purpose of making the image clear, which can be judged by software.

Step S09 is to connect the first image-sensing unit to the first fixed portion corresponding to the first light exit end of the first lens unit. Step S10 is to connect the second image-sensing unit to the second fixed portion corresponding to the second light exit end of the second lens unit. In this embodiment, step S09 and step S10 can be performed simultaneously, and the first image-sensing unit and the first fixed portion are joined by using a component such as bonding glue, and the second image-sensing unit and the second fixed portion are joined.

Step S11 is to electrically connect a circuit bridgeboard to the first flexible circuit board and the second flexible circuit board. In this embodiment, step S11 can utilize components such as solder balls, conductive bumps or conductive paste to firmly and electrically connect the first flexible circuit board and the second flexible circuit board to the circuit bridgeboard.

It is worth mentioning that the steps S06 to S08 can be referred to as active alignment, so as to ensure that the horizontal and inclination tolerances of the camera module are controllable.

In addition, in other embodiments, the first flexible circuit board and the second flexible circuit board can be integrated into a single flexible circuit board. In this embodiment, the first lens unit and the second lens unit are electrically connected to the flexible circuit board by solder balls, conductive bumps or conductive paste, respectively.

As mentioned above, the present invention provides a camera module and a manufacturing method, which are stably connected to a number of lens units by a fixed portion of a holder frame to reduce assembly tolerances of the camera module. The distance between the lens units can be defined by a predetermined distance between the fixed portion of the holder frame, and the direction and angle of the lens axis of the lens unit can be defined by the fixed portion. Therefore, the camera module based on the present invention is applied to the field such as a stereo camera or 3D camera, and the assembly tolerance variable of the camera module can be reduced, so that the image quality presented by the camera module can be improved. Moreover, the complexity of the algorithm can be reduced, and the burden on the processing unit (or the arithmetic unit) can be alleviated.

Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

What is claimed is:

1. A camera module, comprising:
   a holder frame having a first fixed portion and a second fixed portion, wherein the first fixed portion and the second fixed portion are integrally formed;
   a first lens unit, which is set through the first fixed portion, having a first light incident end and a first light exit end;
   a second lens unit, which is set through the second fixed portion, having a second light incident end and a second light exit end;
   a first image-sensing unit, which is disposed corresponding to the first light exit end of the first lens unit;
   a second image-sensing unit, which is disposed corresponding to the second light exit end of the second lens unit;
   a circuit bridgeboard, which is disposed corresponding to the holder frame and facing the holder frame to form a compact appearance; and
   a flexible circuit board, which is electrically connected between the first image-sensing unit, the second image-sensing unit and the circuit bridgeboard,
   wherein the circuit bridgeboard and the holder frame are formed as the compact appearance by folding the flexible circuit board,
   wherein the holder frame together with the first and second lens units have no relative movement with respect to the circuit bridgeboard.

2. The camera module of claim 1, wherein the first fixed portion and the first lens unit are fixed by screwing manner, and the second fixed portion and the second lens unit are fixed by screwing manner.

3. The camera module of claim 1, wherein the first fixed portion is closely matched and fixed with the first lens unit, and the second fixed portion is closely matched and fixed with the second lens unit.

4. The camera module of claim 1, further comprising:
   a first flexible circuit board, which is electrically connected between the first image-sensing unit and the circuit bridgeboard; and
   a second flexible circuit board, which is electrically connected between the second image-sensing unit and the circuit bridgeboard.

5. The camera module of claim 1, wherein the material of the holder frame is plastic or metal.

6. A manufacturing method of camera module, comprising:
   providing a holder frame having a first fixed portion and a second fixed portion, wherein the first fixed portion and the second fixed portion are integrally formed;
   connecting a first lens unit to the first fixed portion and connecting a second lens unit to the second fixed portion,
   disposing a first image-sensing unit on a first flexible circuit board, and disposing a second image-sensing unit on a second flexible circuit board;
   connecting the first image-sensing unit to the first fixed portion corresponding to a first light exit end of the first lens unit, and connecting the second image-sensing unit to a second fixed portion corresponding to the second light exit end of the second lens unit;
   electrically connecting a circuit bridgeboard with the first flexible circuit board and the second flexible circuit board; and
   disposing the circuit bridgeboard to face the holder frame by folding the flexible circuit board to form a compact appearance,
   wherein the holder frame together with the first and second lens units has no relative movement with respect to the circuit bridgeboard.

7. The manufacturing method of claim 6, wherein before connecting a first image-sensing unit to the first fixed portion and connecting a second image-sensing unit to the second fixed portion, further comprising:
   enabling the first image-sensing unit and the second image-sensing unit to generate a first image and a second image; and
   adjusting the relative position of the first image-sensing unit and the first lens unit and adjusting the relative position of the second image-sensing unit and the second lens unit, so that the imaging of the first image and the second image has a predetermined focal length.

8. The manufacturing method of claim 6, wherein the first image-sensing unit is glued to the fixed portion and the second image-sensing unit is glued to the second fixed portion.

9. The manufacturing method of claim 7, wherein the first image-sensing unit is glued to the fixed portion and the second image-sensing unit is glued to the second fixed portion.

10. The camera module of claim 1, wherein the circuit bridgeboard further has two through holes to expose the first lens unit and the second lens unit.

* * * * *